United States Patent [19]
De Wille et al.

[11] Patent Number: 6,167,338
[45] Date of Patent: Dec. 26, 2000

[54] METHOD FOR STORING AND RETRIEVING DATA IN A CONTROL SYSTEM, IN PARTICULAR IN A MOTOR VEHICLE

[75] Inventors: Eberhard De Wille, Schmidmühlen; Michael Ulm, Alteglofsheim, both of Germany

[73] Assignee: Siemens Aktiengesellschaft, Munich, Germany

[21] Appl. No.: 09/154,152

[22] Filed: Sep. 15, 1998

[30] Foreign Application Priority Data

Sep. 15, 1997 [DE] Germany ............... 197 40 525

[51] Int. Cl.⁷ ................................... G06F 17/00
[52] U.S. Cl. ................ 701/51; 701/35; 707/200; 711/153
[58] Field of Search ............... 701/29, 35, 51, 701/54, 57; 477/34, 99, 101; 707/100, 101, 200, 205; 711/153, 171, 202, 209

[56] References Cited

U.S. PATENT DOCUMENTS

| | | |
|---|---|---|
| 5,404,485 | 4/1995 | Ban ............................ 395/425 |
| 5,506,773 | 4/1996 | Takaba et al. ............... 701/35 |
| 5,745,864 | 4/1998 | Hosoe et al. ................ 701/35 |
| 5,893,893 | 4/1999 | Holt et al. ................... 701/35 |
| 6,009,370 | 4/1999 | Minowa et al. ............. 701/102 |

*Primary Examiner*—William A. Cuchlinski, Jr.
*Assistant Examiner*—Gertrude Arthur
*Attorney, Agent, or Firm*—Herbert L. Lerner; Laurence A. Greenberg; Werner H. Stemer

[57] ABSTRACT

The method is used to store and retrieve data in a control system, in particular in a motor vehicle, which contains a computer, a RAM memory and a flash memory. When the control system is switched off, operational data of different types, which can change while the control system is operating and which are required again after the control system is switched on again and which are stored in the RAM memory, are then stored in the flash memory. The flash memory is managed by means of a circular buffer method and can hold multiple copies of the operational data of the same type. When the control system is switched on, the most recent operational data of a respective type of data are determined and output to the RAM memory.

17 Claims, 15 Drawing Sheets

FIG 1

| Start code for production data | Production data | | | | Start code for current regulator adjustment values | Current regulator adjustment values |
|---|---|---|---|---|---|---|
| Start code for error buffer | Error buffer e.g. 100 bytes | | | | Start code for operations timer | Operations timer e.g. 4 bytes |
| Start code for operations timer | Operations time e.g. 4 bytes | Start code for adaptive values | Adaptive values XYZ e.g. 2 bytes | | Start code for operations timer | Operations timer e.g. 4 bytes |
| Start code for production data | Error buffer e.g. 100 bytes | | | | Start code for operations timer | Operations timer e.g. 4 bytes |
| Unused area 0'FFFF | | | | | | |

Start of the FLASH segment e.g. 8 K at 0'04000

FIG 2

| HDR | TYP | ID. | UMF. | CS | DATA | END | BCS |
|---|---|---|---|---|---|---|---|

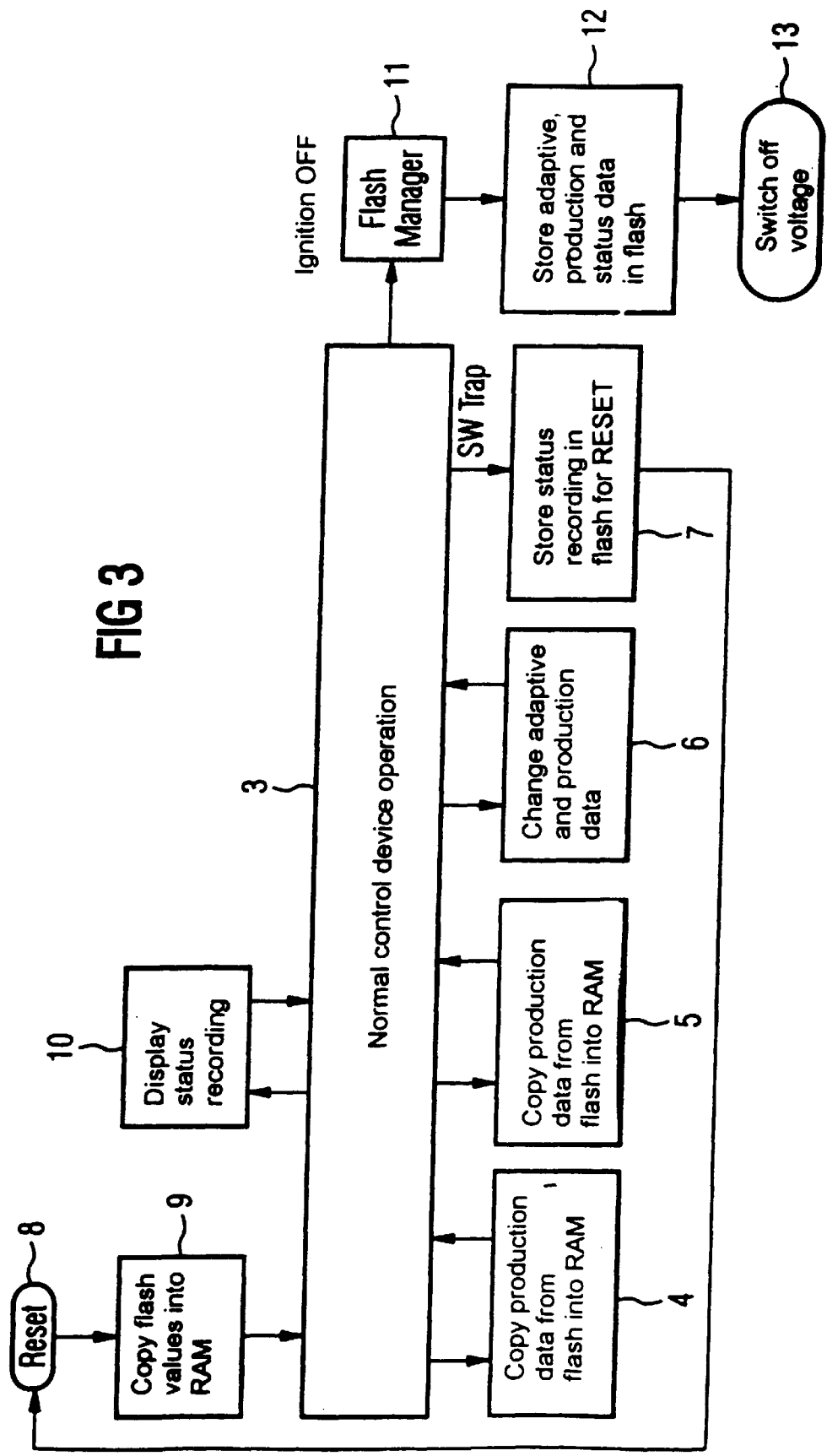

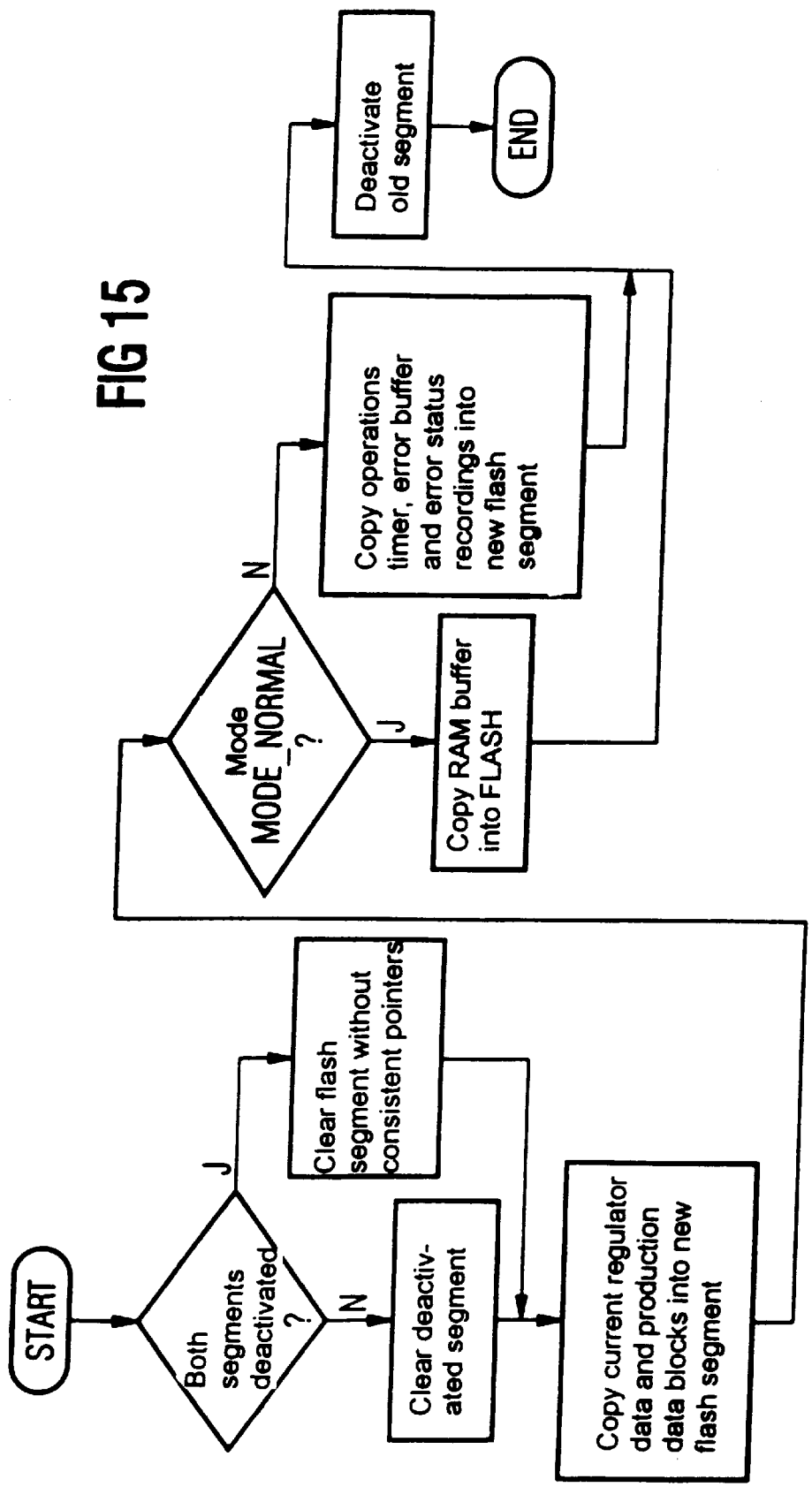

METHOD FOR STORING AND RETRIEVING DATA IN A CONTROL SYSTEM, IN PARTICULAR IN A MOTOR VEHICLE

BACKGROUND OF THE INVENTION

Field of the Invention

The present invention relates to a method for storing and retrieving data in a control system, in particular in a motor vehicle, which system contains a computer, a RAM memory and a flash memory. These data are in particular operational data which can change while the control system, for example the motor-vehicle control system, is operating, and may constitute, for example, adaptive data for the optimized driving of components of the control system, for example an automatic transmission, error buffer data, the current kilometer reading, the overall length of operation etc. These operational data are determined and/or updated by the control system during ongoing operation and held ready in a RAM memory (direct access memory) for rapid access and rapid change. When the control system is switched off, the updated operational data are then stored in a nonvolatile memory, for example in an EEPROM and, when it is switched on again, they are read out of the EEPROM into the RAM memory, so that they can be taken into account during the subsequent operation of the control system. However, EEPROMs require a relatively high operating voltage and have a relatively low data density. In addition, they are costly.

Flash memories (flash RAMs) are also generally known as an alternative to EEPROMs, but they have a limited number of clearing and writing cycles, their number being, for example, not more than just above 10,000. As a result, the service life of a flash memory is often not adequate for the overall number of switching-on and switching-off procedures occurring during the service life of the control system, for example of the motor-vehicle control system, said procedures having corresponding clearing and writing procedures of the flash memory. For example, the overall number of switching-on and switching-off operations of a motor vehicle used frequently for short journeys (for example a taxi) will be several thousand per year, with the result that several tens of thousands of switching-on and switching-off procedures may occur over the service life of the vehicle. If modules were to be used which permit a relatively high number of clearing and writing cycles, this would lead to a significant increase in costs.

In "flash technology replaces EEPROMs" in Design & Elektrotechnik [electrical engineering], Issue 18, 1995, pages 38 to 41, a method which corresponds to the preamble of patent claim 1 is disclosed, in which parameters are stored in a boot-block-flash memory system. In the case of changing parameters, the current parameter values are written successively into a flash memory block and in the parameter which has been set hitherto an indication of the address of the now current parameter is set. When the parameter block is full, the current parameter values are copied into another parameter block and the full parameter block is cleared. As a result of this procedure it is possible to keep the total number of clearing cycles required relatively low. When the system is switched on again, a certain amount of time is, however, required until the respectively current parameter values are found and are available to control the control system.

DE 42 09 905 C1 discloses a system for managing the memory contents of an EEPROM memory which can be overwritten and in which the writing procedures are reduced in number by virtue of the fact that data records which have been newly fed to the system are compared with corresponding data records which are already contained in the memory, and a storage procedure is carried out only if the data records are different.

SUMMARY OF THE INVENTION

It is accordingly an object of the invention to provide a method for storing and retrieving operational data which change during operation. The method permits the operation of a control system to be started rapidly after it has been switched on. The system requires little technical expenditure and is equipped with a nonvolatile operational data memory.

With the forgoing and other objects in view there is provided, in accordance with the invention, a method for storing and retrieving operational data in a control system having a RAM memory and a flash memory. The method comprises: switching on a control system; defining replacement values for only some operational data in the control system; storing the replacement values in a RAM memory, without accessing a flash memory; and subsequently obtaining most recent operational data of at least one data type from the flash memory; and storing the most recent operational data of the at least one data type in the RAM memory.

In accordance with an added feature of the invention, the obtaining step comprises obtaining a plurality of data types from the flash memory; and the step of storing the most recent operational data comprises storing the plurality of data types in the RAM memory.

In accordance with an additional feature of the invention, the met hod comprises switching off the control system; checking if any of the operational data in the RAM memory has been changed subsequent to the step of switching on the control system; if any of the operational data in the RAM memory has been changed subsequent to the step of switching on the control system; subsequently storing in the flash memory, the operational data in the RAM memory which has been changed subsequent to the step of switching on the control system.

In accordance with another feature of the invention, the method comprises associating the operational data with a header characterizing the data type; and storing the operational data and the header in the flash memory.

In accordance with a further feature of the invention, the method comprises using the control system to control a component in an automobile.

In accordance with again an added feature of the invention, the method comprises using the control system to control an automatic transmission.

In accordance with yet an added feature of the invention, the method comprises dividing the flash memory into a plurality of segments; switching off the control system; storing the operational data in one of the plurality of segments without writing over previously stored operational data; and subsequently, when the segment becomes full, storing the operational data in a next one of the plurality of segments.

In accordance with another added feature of the invention, the method comprises associating each one of the plurality of segments with a code indicating whether the respective segment is full, partially full, or empty.

In accordance with a further added feature of the invention, the method comprises after at least some of the plurality of segments have been filled; clearing a segment which has been filled and defining this segment as a cleared segment; and copying operational data from one of the plurality of segments into the cleared segment.

In accordance with another further feature of the invention, the copied operational data is unchanging data necessary for operating the control system.

In accordance with a further again added feature of the invention, the method comprises after the step of storing the operational data in the next one of the plurality of segments: switching on the control system; and searching for the most recent operational data in a currently activated segment.

In accordance with a further added feature of the invention, the method comprises: if all types of the most recent operational data are not found in the searching step, searching a deactivated segment for previous values of operational data not found.

In accordance with a still further added feature of the invention, the method comprises: setting at least one pointer to indicate a position and the data type stored in the RAM memory for each respective one of the operational data.

In accordance with yet a further feature of the invention, the method comprises: subsequent to the obtaining step, checking an integrity of the operational data; and if an error is found during the integrity check; subsequently searching the flash memory for earlier values of intact operational data of the same data type.

In accordance with yet another feature of the invention, the method comprises dividing the flash memory into virtual blocks; finding an empty one of the virtual blocks by checking the flash memory on a block by block basis; and setting a pointer pointing to the empty one of the virtual blocks.

In accordance with yet a further added feature of the invention, the method comprises switching off the control system; searching for the most recent operational data contained in the RAM memory; forming data blocks by combining the most recent operational data; providing the data blocks with a respective code indicating the data type; and storing the data bocks with the respective code in the flash memory.

In accordance with still a further feature of the invention, the method comprises before the storing step, determining the total amount of data to be stored in the flash memory.

Once the control system has been started, the operational data are retrieved in two steps. In order to minimize the loading of the processor during the initialization phase of the control system, for example an automatic transmission controller, initially only backup values for the operational data are held in the RAM memory without accessing the flash memory. The flash memory is usually accessed to read out the operational data stored before the last system shut down, when the processor of the control system is running in the idle mode during a subsequent time interval.

The flash memory can be of standard construction and can have the typical characteristics of high data density, low operating voltage and cost-effective availability. The flash memory is managed by a circular buffer method, so that the operational data to be stored, for example the adaptive data, are no longer located at fixed addresses but are instead stored sequentially in the flash memory, preferably in defined blocks. The latest data values are thus always located at other addresses, for example higher ones, than the older blocks of the same data type. The flash memory contains, in each case, a plurality of operational data of the same type, which differ only in terms of their age.

The method also permits a "history function", since relatively old operating statuses and error recordings are available for an even longer time and can be used to clarify error incidents or, for example, can be used to verify whether a warrantee claim is valid. If, for example, it can be determined that the maximum specified operating temperature of the device has been exceeded, the warrantee will lapse and the claim will not be valid. Unless the recordings of relatively old operating statuses are retained for a relatively long period, it may not be possible to determine a case in which the operating values have been exceeded since, although the device has been damaged by exceeding these operating values, under normal operating conditions the device will not fail until later.

A clearing cycle is not required until the flash memory, or preferably until a block of a segmented flash memory, is full and cannot accept any new operational data. Only in this case is it necessary to reorganize the flash memory by transfering the current data or copying the current data from the full block and storing the current data into a different segment block. As a result of this procedure, a clearing cycle and writing cycle are not required until after a relatively large number of switching-on and switching-off operations of the control system. The result is that the service life of the flash memory is increased many times and is completely adequate for the normal period of use of the control system located, for example, in a motor vehicle.

In order to reduce the number of writing cycles even further, it is checked, preferably when the control system is switched off, whether the operational data have actually changed during the previous operation, that is to say whether they differ from the operational data present at the start of operation. If this is not the case, these operational data which have remained unchanged are not stored in the flash memory so that the relevant writing procedures are not carried out and accordingly the period of time until the flash memory is full and has to be cleared is correspondingly prolonged.

In a preferred embodiment, the operational data are stored in the flash memory together with a header characterizing the data type. The control system can then detect the latest value of each type of data by interrogating the memory and determining the header code. Preferably, the header code is located at the last point in the sequence of the respectively identical type of operational data.

Preferably, the flash memory is divided into a plurality of segments, the operational data in each case being preferably successively stored in a segment until the segment is full, after which the writing of the next segment is started. The segment which has been filled can then be cleared without disrupting the other segment, this clearing procedure is, however, preferably deferred until the other segment or segments of the flash memory is/are also full.

When storing data in a new or freshly cleared segment, preferably not only the current operational data are stored, but also data which do not change and which are required for the operation of the control system are stored in the segment. Examples of unchanging data include manufacturer's data, current regulator adjustment values, etc.

Thus, all the data that are necessary to operate the control system at a particular time are normally contained in a single segment, and this segment is currently used for storing and reading out.

So that it is possible easily to check the segments and detect their status, each segment is preferably provided with a code that indicates whether it is full, partially full or empty. A partially full segment represents the "activated" segment that is currently being used for storage. If it should become apparent that all the required operational data are not contained in the activated segment, preferably an older, deactivated segment is checked, with regard to the required type of operational data, and the latter are read out of it. Thus it is possible to use the previously current operational data as operational data to be used now. These somewhat older operational data are, as a rule, more suitable than any backup values that may have been previously defined.

When the system is started it is possible at first merely to set pointers for all or at least for some of the operational data, such pointers pointing to the appropriate position of the data in the flash memory. If the operational data are then actually required during the ongoing operation, by accessing the pointers, the data can be read out quickly and transferred into the RAM memory.

Preferably, a protection stage is provided in which, when a data block is being read out of the flash memory, first the data block integrity is checked. In the event of a negative result, an earlier, intact data block of the same type of operational data is determined and output.

The start of the free memory space of the flash memory can be determined very quickly by forming virtual blocks and checking characteristic block locations.

When the control system is switched off, preferably the current values of the operational data contained in the RAM memory are searched for and combined to form appropriate data blocks. Before being stored in the flash memory, the data blocks are each provided with a code specifying the type of data in the block. Preferably, during the formation of the data blocks in the RAM memory, the entire resulting amount of data to be transmitted into the flash memory is determined. The flash memory segment can be checked for adequate storage space and rapid storage of the required operational data can be achieved.

Although the invention is illustrated and described herein as embodied in a method for storing and retrieving data in a control system, in particular in a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows the contents of a segment of the flash memory in an exemplary embodiment;

FIG. 2 shows the structure of a data block in the flash memory;

FIG. 3 shows the data flow during normal operation and during a normal control system shutdown or a reset owing to a software error;

FIG. 15 shows a flowchart illustrating the reorganization of the flash memory when the flash memory block is full.

DESCRIPTION OF THE PREFERRED EMBODIMENTS

Figure 4:
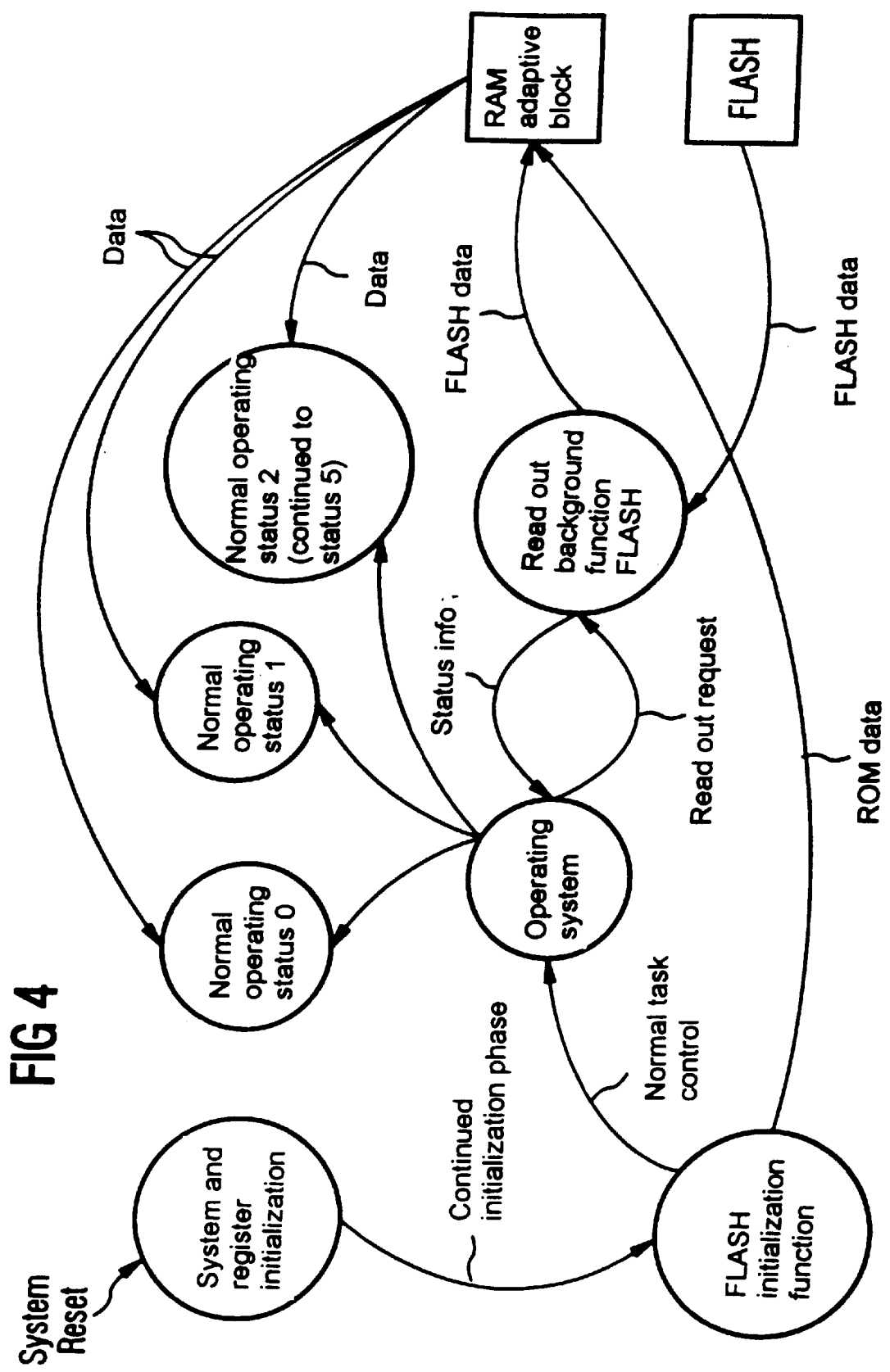
FIG. 4 is a schematic view of the storage of data in the RAM memory after a system reset.

The method according to the invention is described below in a control system that is contained in a motor vehicle and is used to control the automatic transmission. However, the method can also be applied to other control systems that operate intermittently and store updated data into a nonvolatile memory.

FIG. 1 shows an example of the memory contents of a flash memory 1 that represents a component of the control system. The segment illustrated comprises, for example, 8 kilobytes and starts at the address 0'4000. Different types of operational data are stored in the flash memory 1, namely, fixed operational data and operational data which is updated or changed during operation. Fixed operational data only have to be stored once. Examples of fixed operational data include production data, which can be stored when the production line is terminated, and current regulator adjustment values that are used to adjust the current regulator for the automatic transmission mechanism. Examples of operational data that change during operation include error buffer data, counter data indicating the overall length of operation until now, adaptive values for adaptively changing variables, etc. As is clear from FIG. 1, the respective operational data are progressively stored in succession without maintaining a specific order. The operational data that do not change during operation, for example, the production data, as a rule are stored only once. Updated data, for example, the counter data which indicate the overall length of the operation data are stored, each time the control system, that is to say the motor vehicle, is switched off. The error buffer data and the adaptive values are also stored in the flash memory whenever the control system is switched off, if they happen to have changed in comparison with their status when the system was started. Only operational data that have changed are stored when the control system is switched off, and this data is added directly to the end of the flash memory area that has been written to until now, without maintaining a specific order. The result is that the flash memory area fills up slowly so that a correspondingly long time period passes until the memory area is filled and a clearing procedure has to be carried out.

Generally, the flash memory block is progressively occupied by the changing operational data as long as adequate free space is available. However, if the memory block is full, a reorganization of the memory block may be initiated in order to store the operational data of the memory block being used. During the reorganization first, the last (most recent) copy of all the changed operational data is copied into a second block, which possibly has been cleared in advance, then the new, current operational data from the RAM memory are copied into the second block or added to it. Finally, the control system, for example, the automatic transmission control unit is switched off or a system reset is carried out. When a system start occurs, the operational data blocks are interrogated by means of pointer operations. The pointers are set to the header, found in the most recent block, of the corresponding type of operational data. In this way, the last valid operational data block of this type is designated. The details of the storage and retrieval of the data are described in more detail in the text that follows.

Updated or changed operational data that are stored in the flash memory 1 also include adaptive data (adaptive values) that are used, for example, for controlling the transmission, and error status recordings which may relate to an error buffer block, or status recordings, for example of register values, which are stored when software errors (software traps) occur.

A specific design of the flash data blocks is used in order to permit all these different modes of operation to be handled easily by means of standardized handling routines for the flash memory access. FIG. 2 shows the structure of such a data block 2 which is stored in the operational data section of the flash memory 1 and always has the same design for all types of data. The data block 2 contains, at the start, a header code HDR, then a code "TYP" which designates the corresponding buffer in the RAM memory for the flash memory contents. This is followed by a code "ID" which serves to designate the type of data. The block section "UMF" signals the number of data bytes which are contained in the section "data", including the associated checksum. The data section CS contains the checksum. At the end of the data block, the data section "end" contains a defined bit pattern which signals the end of the data block to the control system and which is followed by the block checksum BCS.

The diagram in FIG. 3 provides an overview of the normal control system operation. Generally, an EEPROM system is simulated here so that during normal operation, the control system behaves as if it were equipped with an EEPROM memory instead of a flash memory. At the start of the normal control system operation, which is indicated with the reference 3, firstly production data are copied from the flash memory into the RAM memory (blocks 4 and 5) and then the adaptive data during the ongoing operation and, if appropriate, the production data are also matched (block 6). If a critical software error occurs, which requires the control system to be reset, a status recording of the registers etc. is firstly stored in the flash memory (block 7). The status recording enables the software error to be isolated more easily, and thus eliminated. After the reset (block 8) has been carried out, the relevant operational data contained in the flash memory are copied into the RAM memory (block 9) and, if appropriate, the status recording is indicated (block 10). If the control system is switched off, for example the ignition switch is switched off, the operational data (adaptive data, status data etc.) and possibly also the changed production data are stored in the flash memory (block 12) by means of a flash manager 11, after which the voltage supply is then switched off (block 13).

Generally, the operation of the control system is divided into three phases: a) data retrieval procedures before the execution of the normal control system operation is started, b) operating procedures during normal operation of the control system, and c) switching-off procedures for storing in the flash memory the current information which is required for the next time the system is switched on. These operations are explained below in greater detail.

The data retrieval procedure when the system is started is divided into two sections (see FIG. 4). The first section is executed during the initialization of the control system. Since the timing of the system start during this initialization phase is very critical, the flash memory is preferably still not accessed at this time. For this reason, during this initialization phase, only a few backup values (ROM data) are stored in the corresponding data areas of the RAM memory as a backup for the correct operational data contained in the flash memory. Thus, the most important procedures can be started at the earliest possible time so that the normal control system operation is reached quickly. The reading out of the operational data from the flash memory is then carried out only as a background task, so that the CPU which normally operates largely in idling mode during this period is then used for data retrieval. Thus, the normal operation of the control system is loaded as little as possible. As a result, the most recent operational data are then stored in the adaptive block of the RAM memory via the background function "read out flash". The operational data stored in the RAM memory are then used to control the normal operation, according to requirements, under the control of the operating system. Since FIG. 4 is self-explanatory, no further description is necessary.

The procedure described above applies to a cold start in which the control system voltage has previously been switched off. If a system reset has occurred under software control, it is firstly checked whether the adaptive data contained in the RAM memory (operational data) are correct, which is brought about by recalculating their checksums and by comparing the results with the previous checksum. If it becomes apparent here that the operational data contained in the RAM memory are correct, the flash initialization function and the "read out flash background function" are not carried out.

When the system is started, firstly only the relevant values for the current regulators are loaded into the RAM memory, these values being tables which contain offset and gradient values for the respective output values of the current regulators and temperature compensation values. By means of this procedure it is possible to keep the loading of the CPU during the initialization phase as low as possible. Since there is still no access to the flash memory during this process, at first, defined backup values ("ROM data") are, as stated above, used and they permit reliable operation of the current regulators.

The operational data which are retrieved and used during the system start for normal control system operation (without test equipment and the like) are, in particular, current regulator adjustment values, adaptive values for controlling the control system, for example for controlling the transmission, the error buffer block data, the standard error status data and the overall length of operation.

If it should become apparent during the interrogation of the flash memory that the desired data blocks cannot be found or that they are faulty (checksum checking signals errors), backup values are used from a ROM or the data are merely set to zero. The latter applies, for example, to the overall length of operation or to the error handling tables. In this way, adaptive data blocks can be generated without previous definition in the starting phase of the start of the control system.

Figure 5:
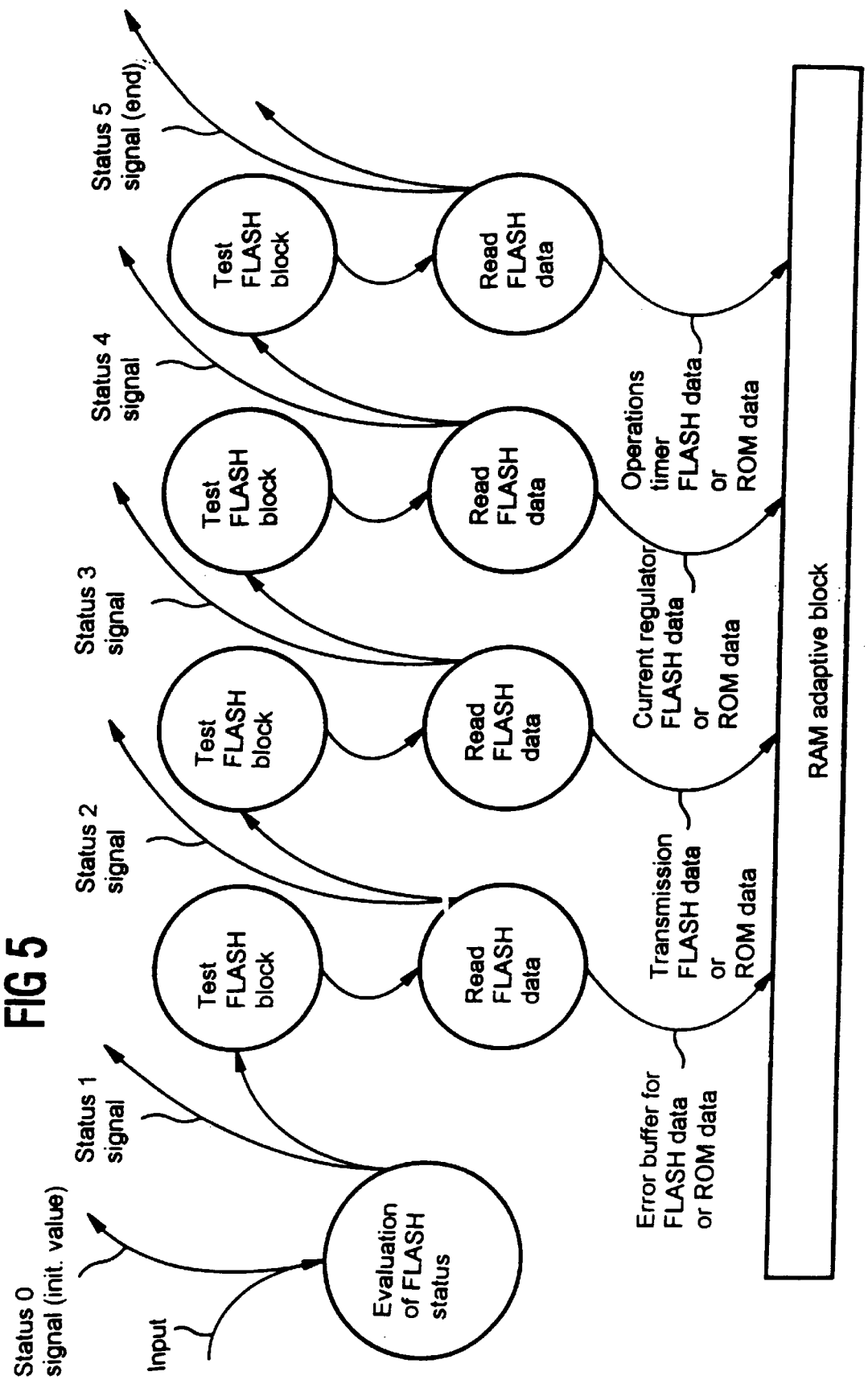
FIG. 5 shows further details of the storage of data in the RAM memory in an exemplary embodiment.

In FIG. 5, this procedure is illustrated in the form of a flowchart. As is shown there, initially in each case a flash memory block is checked and, if it is intact, read. Otherwise, the corresponding backup values are stored in the associated adaptive block of the ROM memory. This procedure is carried out successively for the error buffer data at first and then for the transmission data, the current regulator data and the operational timer data, which are respectively stored in the flash memory. After the storage of the operational timer data has been terminated, a "status 5" signal is output, and it signals the end of the storage of the adaptive block of the RAM memory.

So that rapid access to the flash memory can be carried out if, for example, operational data which have not yet been stored in the RAM memory are required, there is provision of a background function which analyzes the flash memory contents in order to determine its status and the respective latest operational data blocks. In this process, in each case a pointer for each type of block of the operational data is set, which pointer indicates the most recent operational data of this type of block. Since this procedure takes place in the background, the efficiency of the system is not adversely affected by it. In particular, the analysis takes the form that firstly the active flash block is determined, the end of the occupied flash memory area is determined, so that the position for a subsequent storage of operational data is signaled, and a pointer is set for each type of block in the active, occupied flash memory area.

Figure 6:
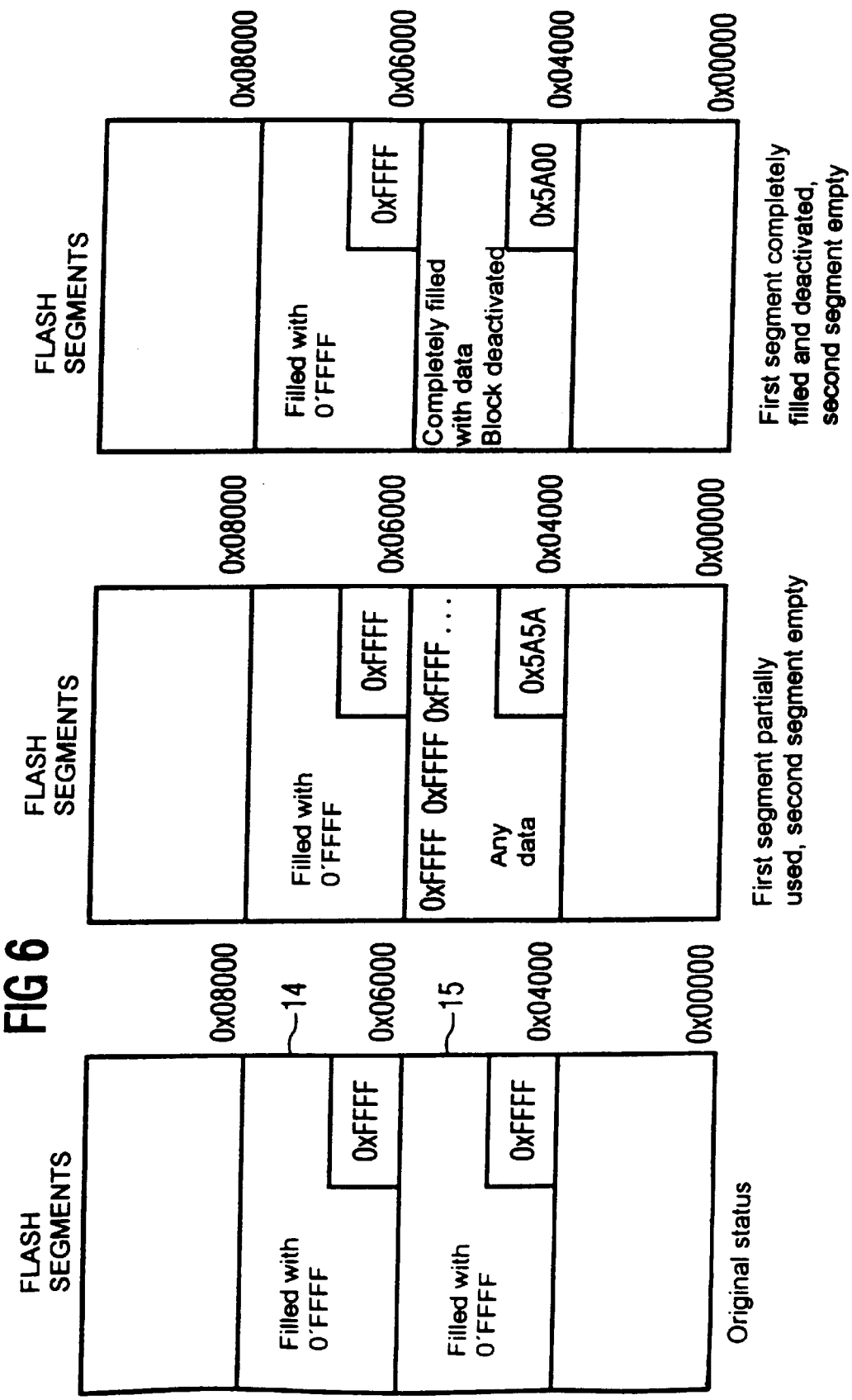
FIGS. 6 and 7 show the successive filling of the segments of the flash memory with operational data.
Figure 7:
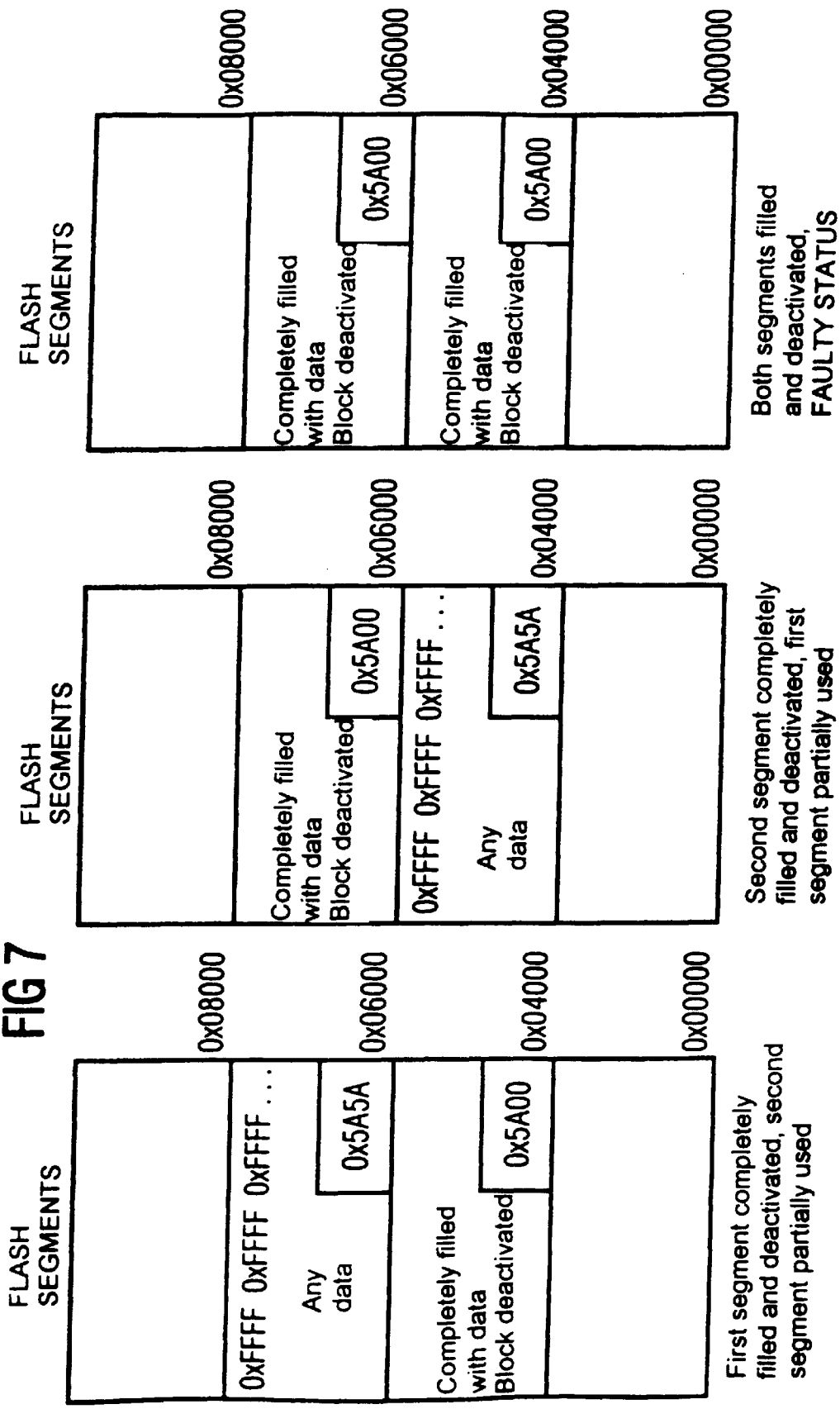

In the exemplary embodiment shown in FIGS. 6 and 7, the flash memory 1 has two segments 14, 15 for storing the operational data which can change and which lie, for example at the address area 0'04000 to 0'05FFF (first segment) and in the address area of 0'06000 to 0'07FFF (second segment). The other flash memory sections are reserved for other tasks. The number of segments of the flash memory which are provided for the storage of operational data may, however, also have a different value, that is to say, for example, 1 or 3 or more.

Both segments are respectively successively filled completely with operational data until reorganization is forcibly brought about. So that the control system is informed of which segment can be used, either 0'FFFF (this indicates an empty segment), 0'5A5A (this designates the header of a valid data block and indicates a partially filled segment) or 0'5A00 (this indicates a full segment) is written into the first address location. If a segment has been filled, the other segment is then used for storage purposes and the first header of the full segment of 0'5A5A is changed to 0'5A00 so that this segment is then deactivated. If both segments of the flash memory each contain 0'FFFF at their first address locations (0'04000 and 0'06000), this indicates that the flash memory is in its initial status and both blocks are empty. If none of the three valid possibilities 0'FFFF, 0'5A5A or 0'5A00 is found at the first flash memory cell of the memory block, the pointer pointing to the start of the flash memory is incremented until either a valid option is determined or the end of the flash memory block is reached. In FIGS. 6 and 7, the address statuses and memory contents of segments 14 and 15 are shown in respectively different occupation statuses.

During the analysis of the flash memory status, the analysis function transmits back to the control system a corresponding signal value which indicates the occupation status.

If both flash memory segments are completely empty or else both segments have been incorrectly deactivated, the first segment 14 is used for the next storage procedure.

Figure 8:
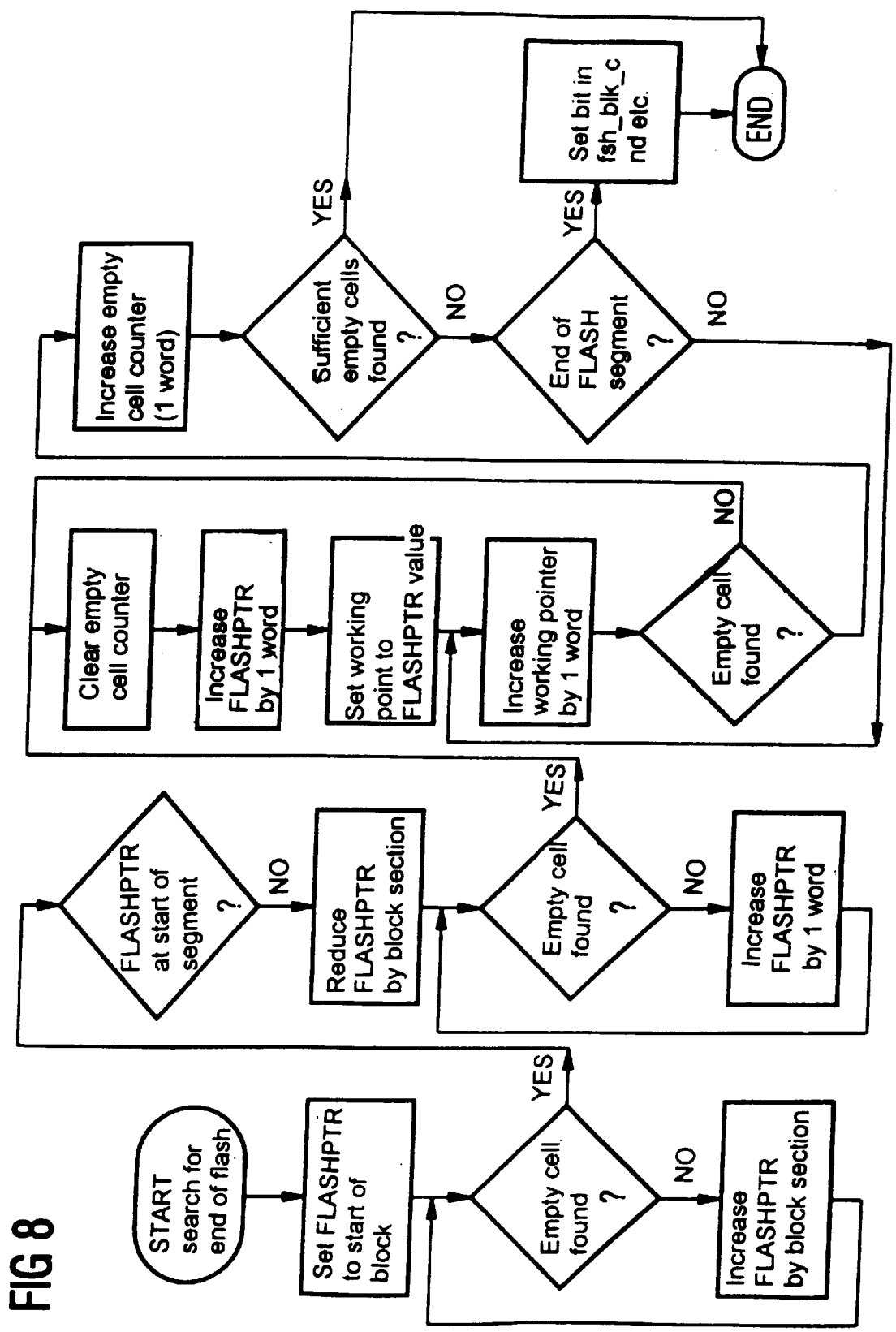
FIG. 8 shows a method for rapidly finding the end of a used flash memory block in order to add new operational data in this area.

In order to ensure that there are no free spaces remaining in the flash memory when new operational data blocks are stored, in each case the end of the occupied area is determined, which is done by means of the program routine as shown in FIG. 8.

FIG. 8 illustrates a flowchart which is self explanatory, of a program for quickly determining the end of the occupied memory area in the currently used flash memory segment. In this way, new data can be added on directly to the end of the already occupied memory area. The flash memory is divided into virtual blocks (sections) which are 256 bytes in size. The scanning starts with the checking of, in each case, the cell located at the start of each block. If it is determined that this cell contains data 0'FFFF (or other data indicating an idle status), it is assumed that the entire block is empty. However, if it is determined that the cell contains some other data, this block is occupied and cannot be used. The next virtual block is then checked. This examination is continued until the end of the segment currently used for the operational data is reached.

However, if an empty block is determined, the working pointer at the preceding, virtual block (256 bytes in size) is decremented. Starting from this position, the flash memory is scanned on a word-by-word basis until an empty cell (0'FFFF) is detected. A previously defined number of further cells adjoining the empty cell is then checked. If these are also empty, it is assumed that the start of the free flash memory area has been reached. The number of cells which are checked for their idle status must be sufficiently large to be able to hold the entire number of possible adaptive blocks supplied by the RAM memory during the next flash storage procedure when switching off occurs. If cells which are not free (for example defective cells) are found during the checking, the working pointer is incremented until a sufficiently large free space is available.

Finally, a global pointer, indicating availability, is set at the first free cell of the flash memory area following the preceding, occupied space. At the same time, it is confirmed once more that the amount of data to be received during the next storage procedure can be stored in the available free flash memory area. The further program sections are informed that there is sufficiently large space available for the next memory procedure by setting a corresponding bit in a variable fsh_blk_cnd to, for example, the value 1 (initial value=0). However, if there is no longer a sufficiently large space available in the active flash segment to hold the new data, the global pointer indicating availability is set to the last word address of the active flash memory block, that is to say 0'5FFE or 0'7FFE, and the corresponding bit in the variable fsh_blk_cnd is set to zero.

Figure 9:
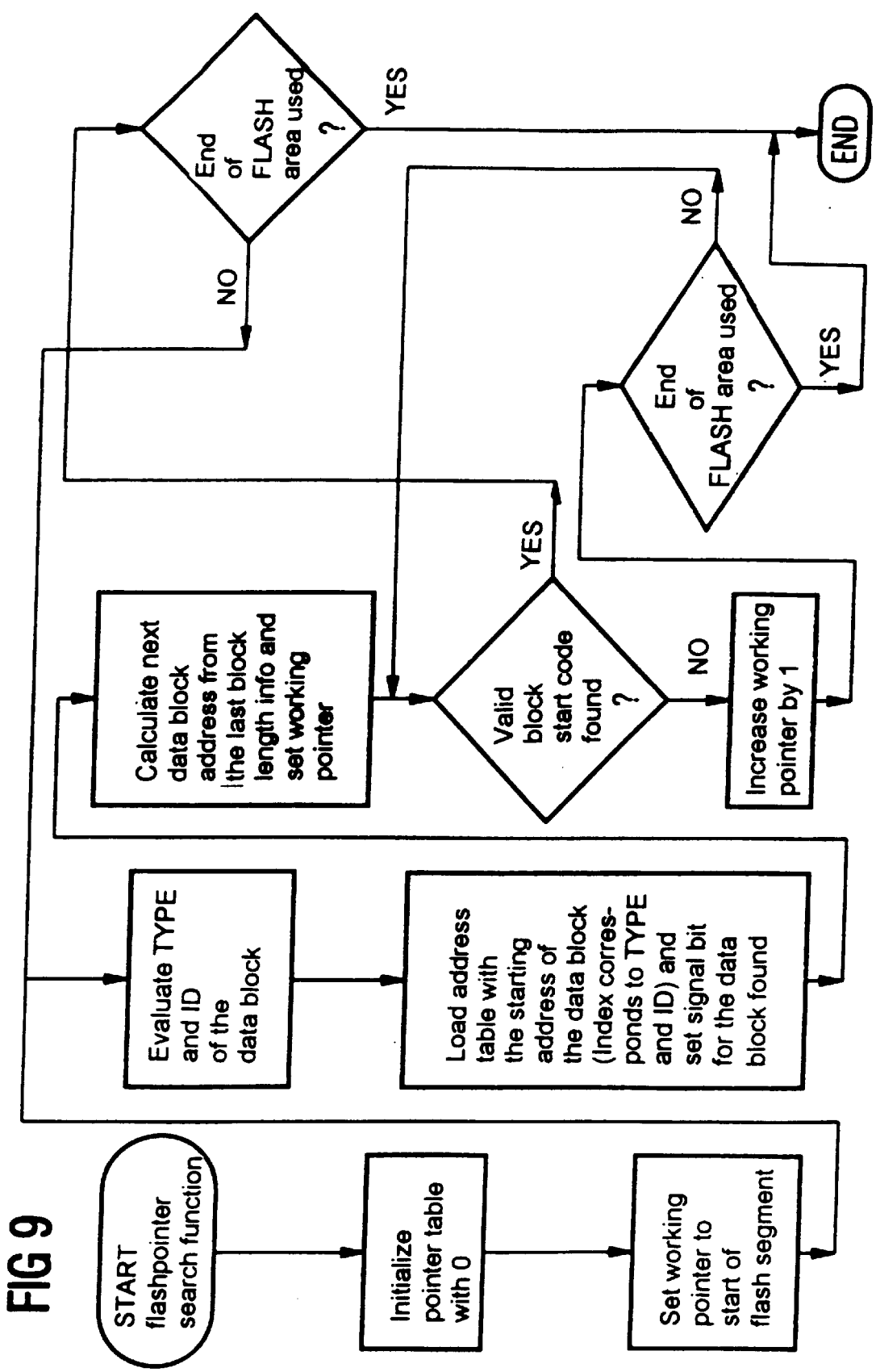
FIG. 9 shows a flowchart of a routine that is used to set pointers for each type of operational data block.

The subsequent step of the analysis of the flash memory has the purpose of setting a pointer to any type of information block (operational data block) which is defined by the information "TYP" and "ID" (see FIG. 2) and is stored in the flash memory segment. This function is represented by the flowchart which is illustrated in FIG. 9 and is self-explanatory. The flash memory is checked here from the start of the active segment as far as the position of the global pointer indicating availability. If a valid operational data block header with "TYP" and "ID" is determined, the starting address of this data block is transmitted to a table together with a corresponding index for the respective type of data block. In addition, a signal bit which indicates that a data block of a specific type and with a specific code has been determined is set. If the information "TYP" and "ID" is determined during the further interrogation of the flash memory segment once more, the new address is stored instead of the preceding one. Here, the integrity of the data blocks can also be checked. However, this checking is preferably not performed until this data block is actually to be read out of the flash memory.

At the end of this program routine, the pointer table is always provided with the last, that is to say latest, address of the respective data blocks. If a data block of a specific type has not been determined, a specific value, for example a zero, is written into the pointer table, indicating that no valid data for this type of data block has been determined in the flash memory, so that ROM backup values have to be used.

If it has not been possible to assign all the pointers during the checking of the flash memory segment, before the value "0" is written into the corresponding position a search is firstly made, using the same algorithm (FIG. 9), in the other deactivated flash memory segment for the data blocks which are still missing, and the results which are acquired during this process are stored in the pointer table.

If a data block is to be read out of the flash memory, its integrity is firstly checked. This is done by means of the routine shown in FIG. 10. Here, the address which is stored in the pointer table is used to access this data block. The data block is then interrogated and the block checksum is calculated. This calculated checksum is compared with the block checksum stored at the end of this data block. If the checking is positive, the data block is read out and stored in the corresponding RAM buffer. If a discrepancy occurs during the checking of the checksum ("checksum OK?"), the flash memory is checked backward starting from the specified address value in order to determine the preceding data block of the same type (same type and same identification ID). The pointer is then set to the previous (intact) data block and this is signaled to the calling function. If no result is obtained during the search for an earlier data block, this is signaled to the calling function and ROM backup values are then loaded into the corresponding RAM buffers for the adaptive operational data.

Figure 10:
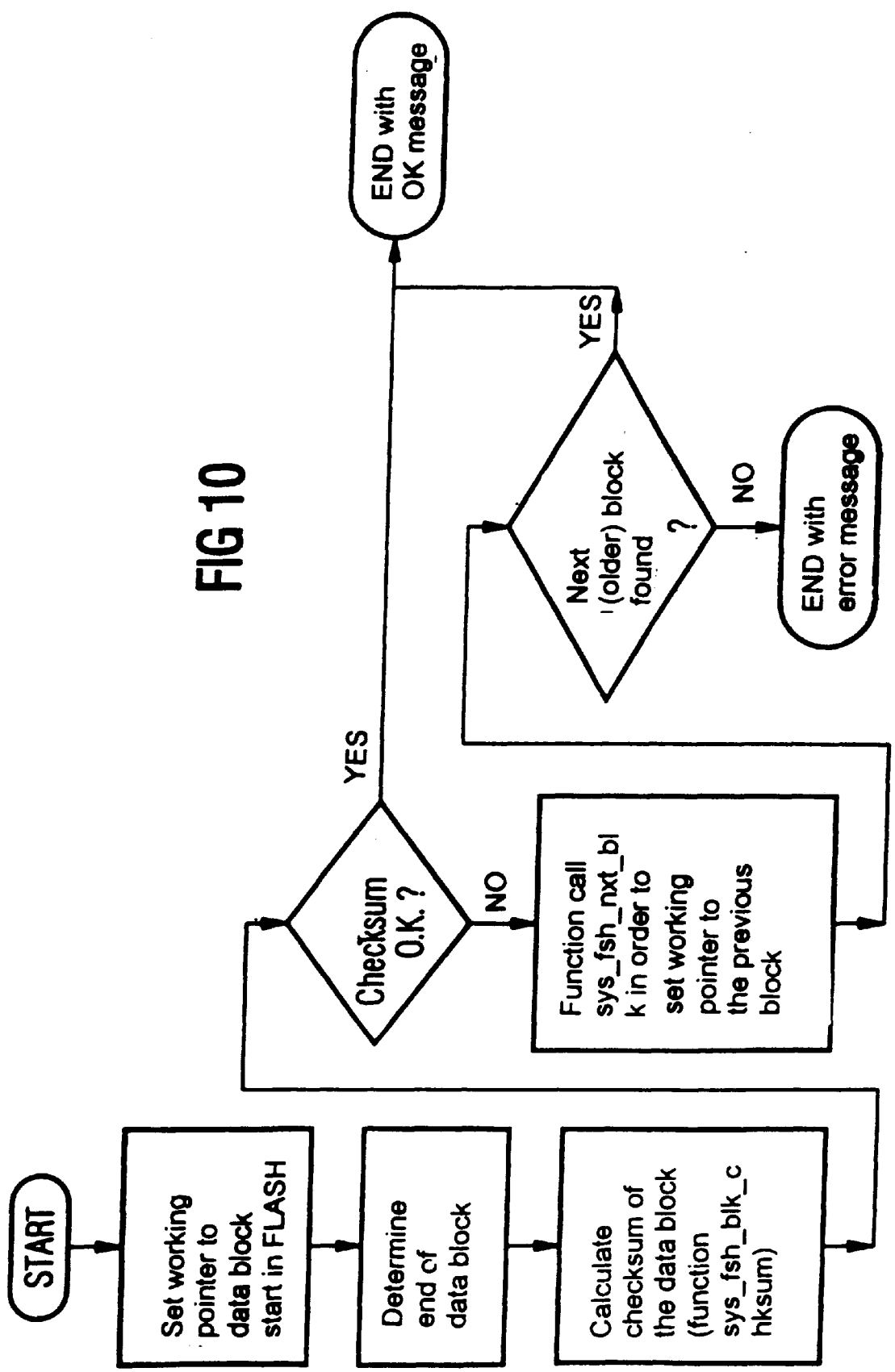
FIG. 10 shows a flowchart of a program routine for checking the integrity of an operational data block in the flash memory.
Figure 11:
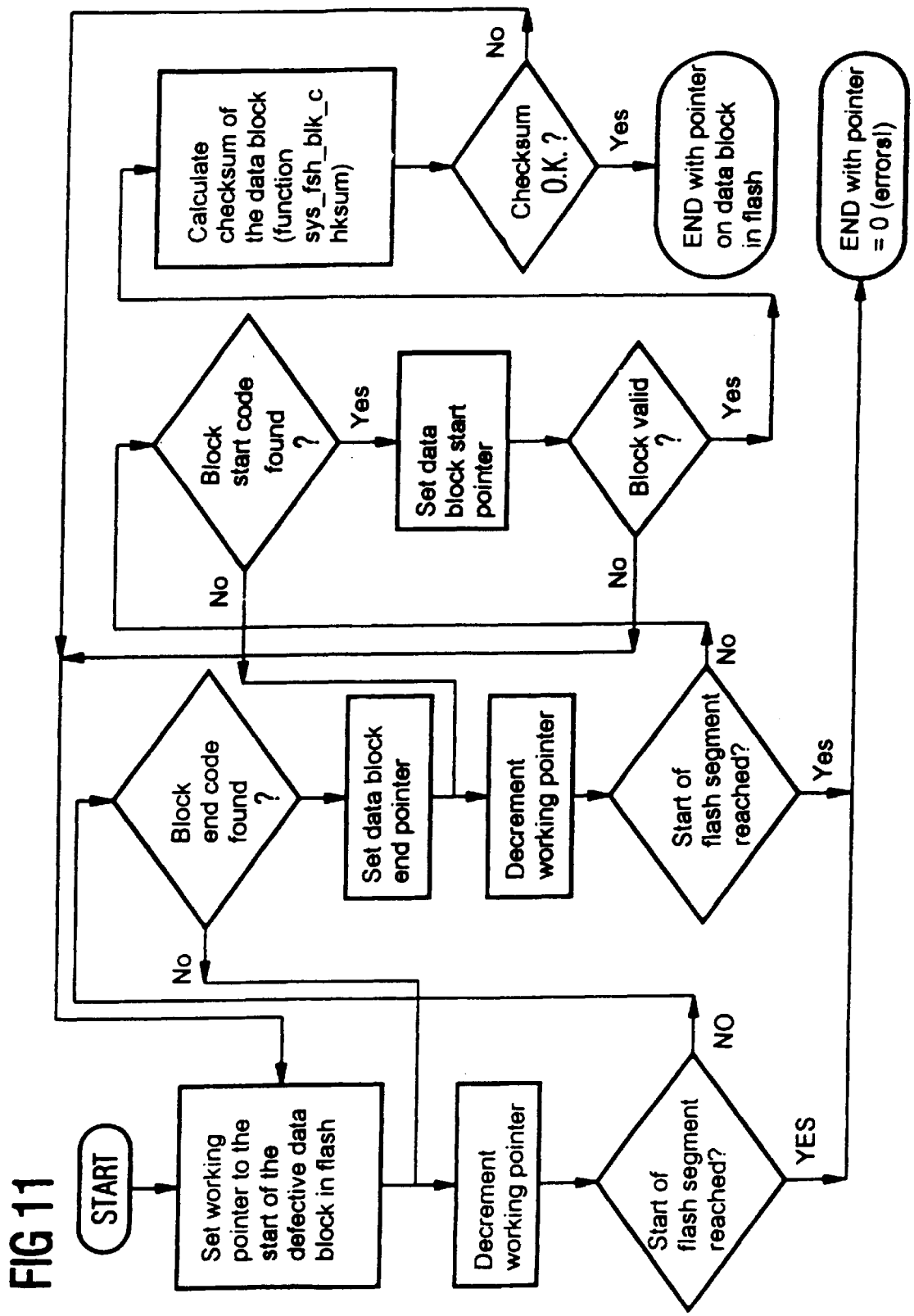
FIG. 11 shows a flowchart of a further program routine that is set during the checking of the data block integrity.

FIG. 11 shows the function call "sys_fsh_nxt_blk" shown in FIG. 10 for determining an earlier, intact data block, in greater detail. FIG. 11 is self-explanatory and does not require any additional comment above and beyond the explanations above.

During the ongoing operation of the control system it is also possible to access the flash memory in order, for example, to load data blocks into the RAM memory which have not yet been loaded at the system start, since they are required only in rare cases. When necessary, data can also be returned from RAM buffers for storage in the flash memory, for example to update the data. This can be controlled by the application system. Here, manufacturer's data can also be modified (for examples after an intervention for adjustment or repair) and these modified manufacturer's data can then be returned for storage in the flash memory. Basically, the procedure during the searching for and return and storage of the operational data is respectively the same, irrespective of whether the data are manufacturer's data, adaptive data, status recordings during a major software error or the like.

Figure 12:
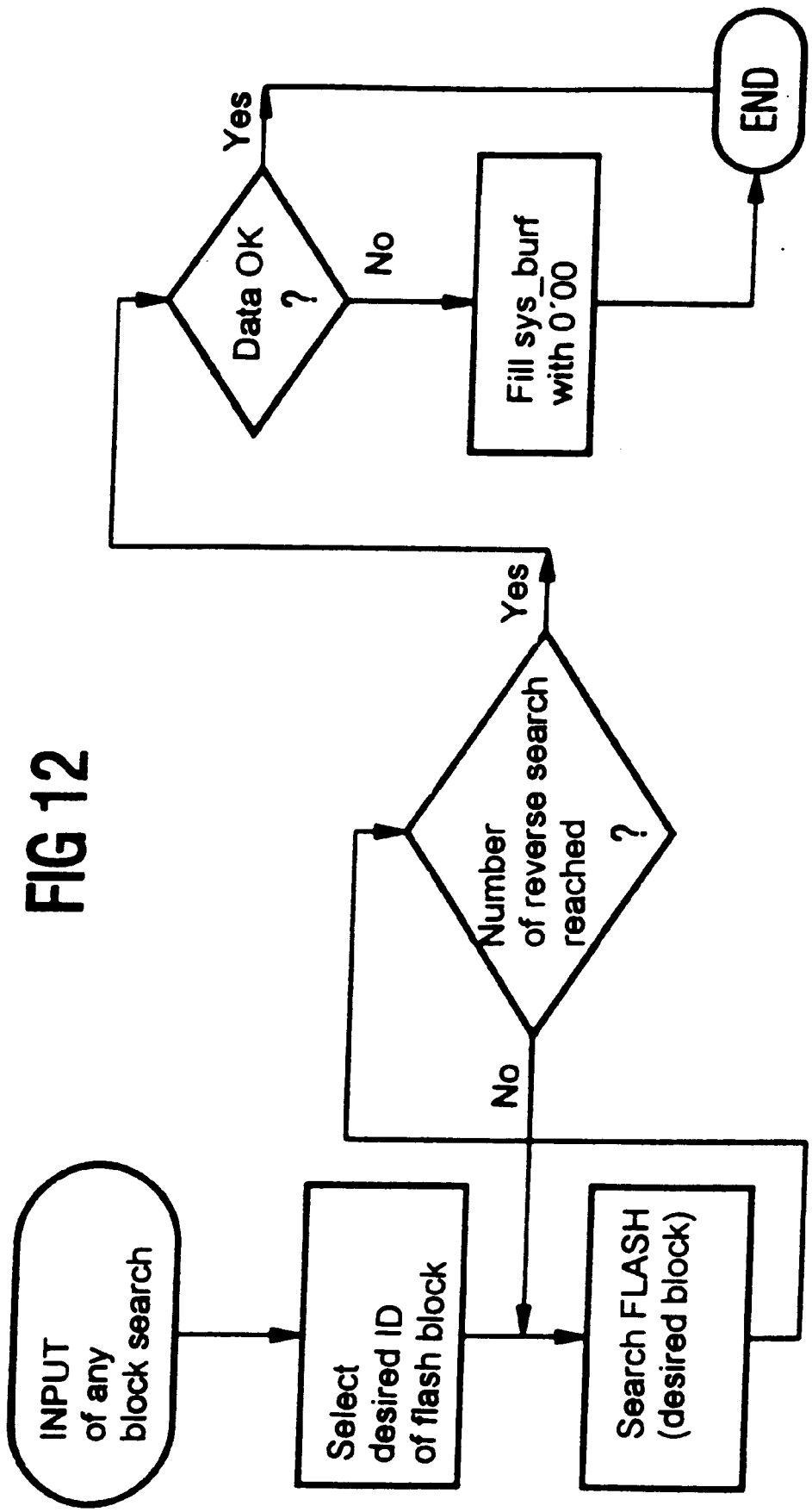
FIG. 12 shows a further flowchart for searching and checking an operational data block in the flash memory.

FIG. 12 shows a flowchart with which a selective search for an earlier (that is to say not the current) data block of a specific type of operational data can be carried out. Here, it is possible to specify whether the operational data is of a second latest, third latest or of an even older block of the specific type ("number of the reverse search"). During this procedure, the same flash search algorithm is used as during the previous part of the program which reads out the data from the flash memory after a system reset.

During the ongoing operation, the operational data which can change, for example the adaptive data, and which are contained in the RAM memory are respectively updated, so that the most recent values to be returned and stored in the flash memory are contained in the RAM memory when a system shutdown is carried out.

During the ongoing operation, error status recordings can also be stored in the RAM memory when software errors occur, which recordings can then be protected in the flash memory. These values which are protected during this status recording may be, for example, the rotational speed, the system voltage, the temperature, the pressure etc.

In the text which follows, details on the formation and storage of the data blocks in the RAM memory and the flash memory in the case of a system shutdown will be explained. When the control system is operating normally, the operational data, for example the adaptive data or the error buffer data, which can change are stored in associated RAM buffers. When the system is shut down, these data must be transferred to the flash memory. For this purpose, they are initially changed into the desired format of the flash data blocks. Before they are transferred into the flash memory, firstly all the relevant RAM buffers are interrogated and their data are combined into a single block. This requires not only that the data which are stored in the flash memory are correctly read out of the associated RAM buffers and combined, but also that the corresponding associated block components such as "header", "TYP", "ID", "end" etc. are generated. During this function, the standard area of the RAM is used as an output position and processed in accordance with the pointers. The RAM position is normally used by other program parts. However, since these no longer run (next action after the flash memory programming is to reset the system or switch off the voltage), this area can be used without disrupting the other programs.

Figure 13:
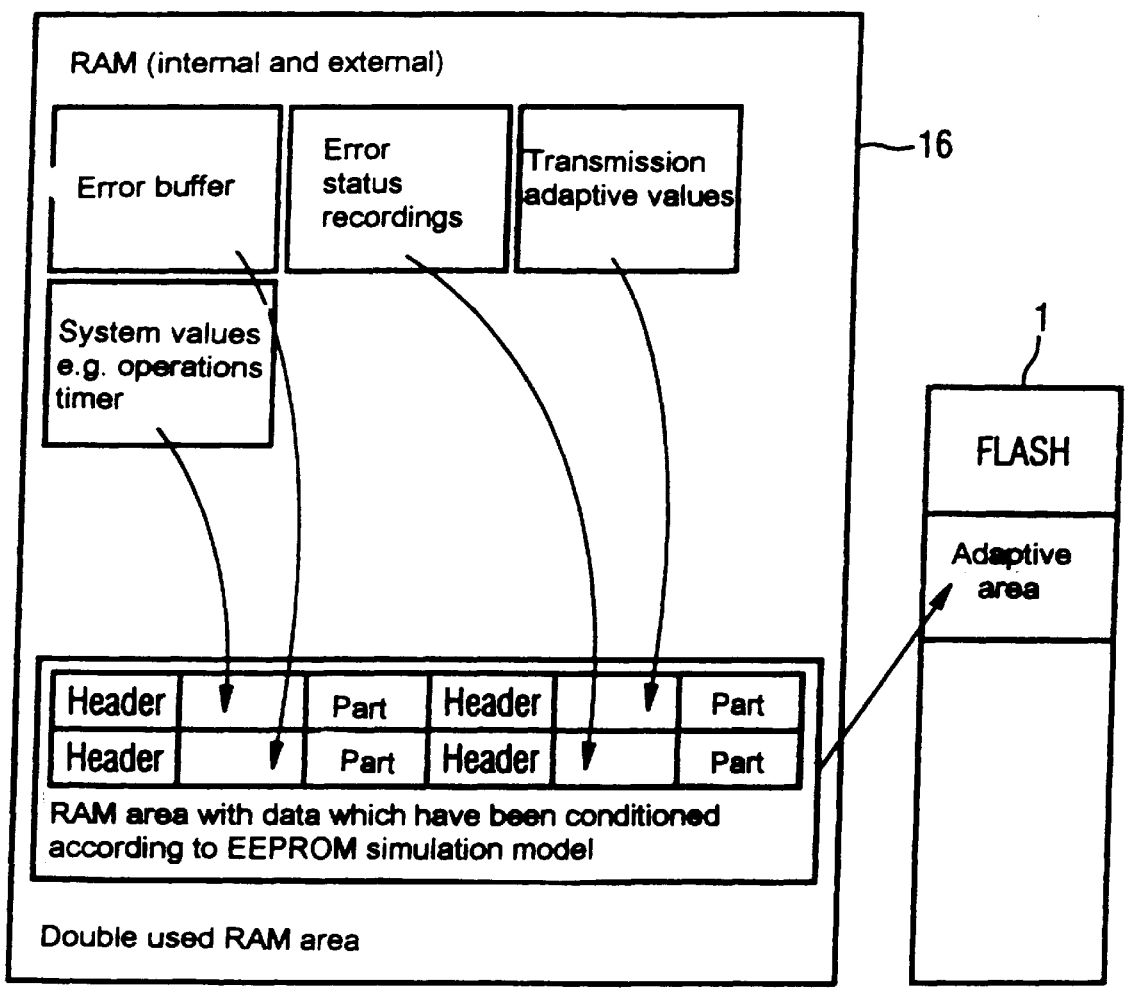
FIG. 13 shows an example of the formation of data blocks for storage in the flash memory during a system shutdown.
Figure 14A:
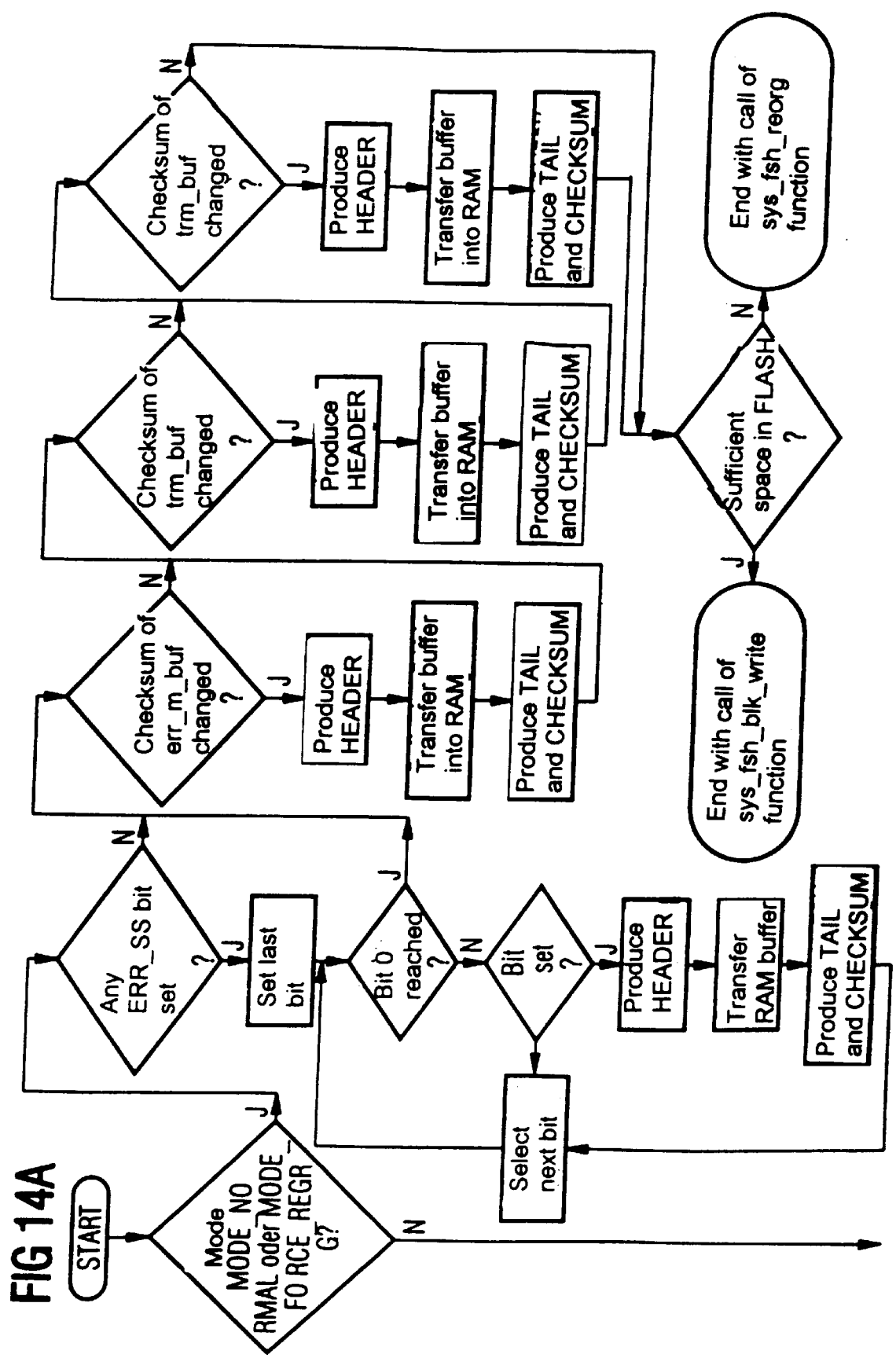
FIGS. 14A–14B flowcharts of the program routine for forming the operational data blocks for storage in the flash memory.
Figure 14B:
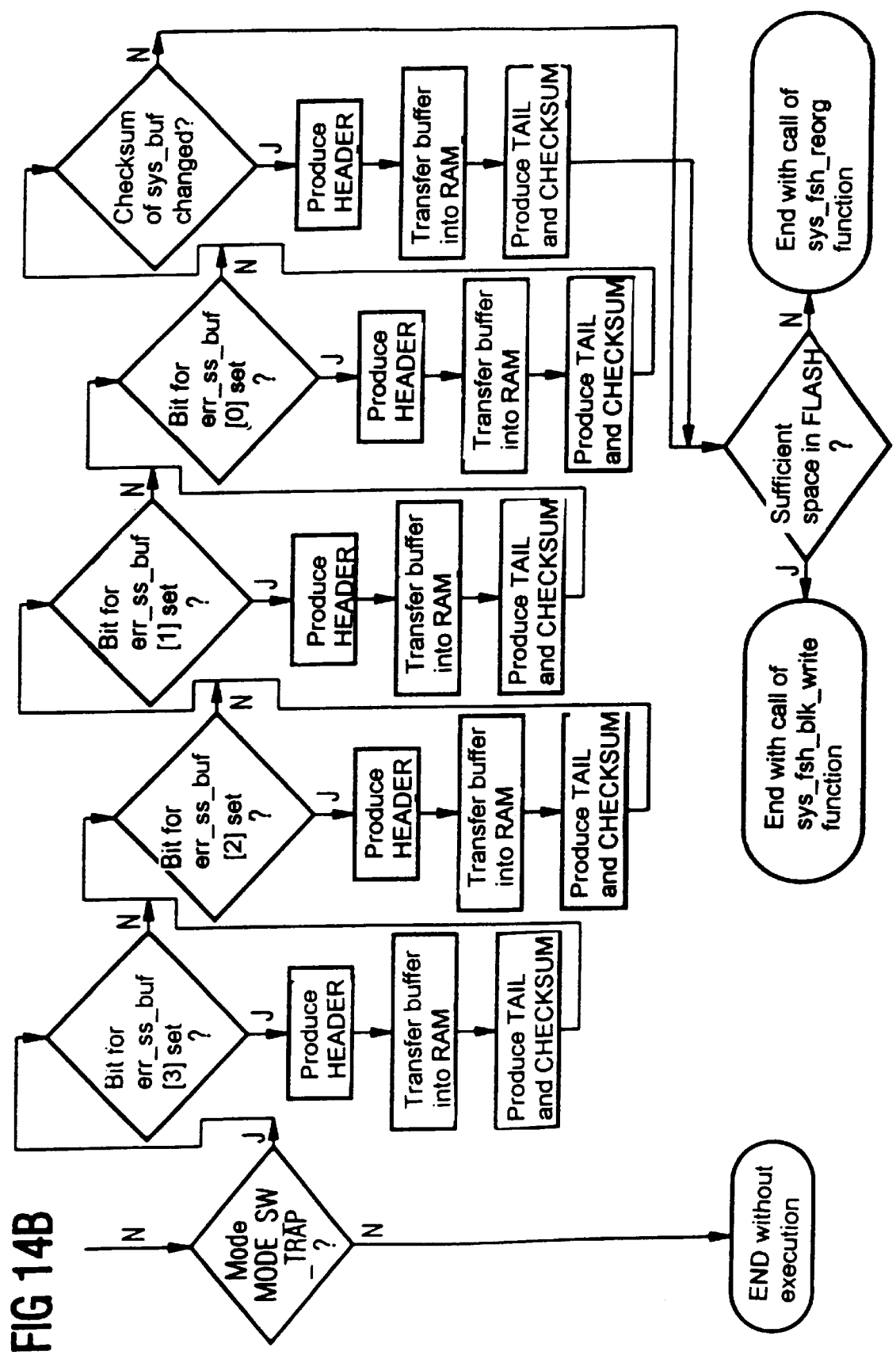

FIG. 13 shows how the individual variables ("error buffer", "error status recordings", "transmission adaptive values", "system values") in the RAM memory 16 are transferred into the lower RAM area, used doubly, in the form of data blocks with header and end code ("tail"). After their generation has been completed, the data blocks are transferred into the adaptive area of the flash memory 1, that is to say into the segment 14 or 15. Here, the data blocks have the structure shown in FIG. 2. The working steps for the generation of the data blocks and for writing into the flash memory are shown in FIG. 14. The current storage of the data in the flash memory is carried out with a function "sys_fsh_blk_write". If there is no adequate storage space available in the adaptive area of the flash memory, a function "sys_fsh_reorg" for reorganizing the flash memory and for subsequently storing the data is called.

In the exemplary embodiment shown, the operational data to be stored in the flash memory are selected as a function of the respectively selected mode "MODE_NORMAL", "MODE_FORCE_REORG" or "MODE_SW$_{TRAP}$". The mode "MODE_NORMAL" represents the normal mode of the control system, for example of the transmission control system, in which possible standard errors are detected and treated by means of an error manager. The mode "MODE_FORCE_REORG" constitutes a mode in which it is necessary to reorganize the flash memory before storing the data. The buffers and memory contents which are respectively selected in these two operating modes are the error status recordings "ERR_SS" if corresponding codes are set, the error buffer "err_m_buf", the transmission adaptive values "trm_buf" 25 and the system data "sys_buf", in particular the overall number of operating hours.

The mode "MODE_SW_TRAP" is activated when a software error which leads to a system reset occurs, and this mode brings about the detection and storage of an increased number of error status recordings "err_ss_buf [0], [1], [2], [3]" and the operational data "sys_buf".

As is clear from FIG. 14, before the data words for the operational data, for example the transmission adaptive values, the error buffer data or the overall operating time are formed, it is firstly checked whether these values have changed at all in comparison with the previous status. This is done by checking whether the checksum of the corresponding data has changed (see the decision blocks given in each case at the top). Only if the corresponding data have changed in comparison with their status during the system start, and thus the checksum has changed, are the corresponding data words with header, end code and checksum generated and stored in the doubly used RAM area of the RAM memory 16 for writing into the flash memory.

During the storage of the data words in the doubly used RAM memory, a global pointer is used which is initially set to the start of that RAM memory which is used to collect the data words intended for the flash memory. While this data area is being filled, the pointer is always made to follow in such a way that it always points to the end of the collected data. The function which is responsible for writing the data into the flash memory can thus determine the amount of data which is to be transmitted into the flash memory by comparing the current position of the pointer with the initial value.

FIG. 15 shows the sequence of the function "MODE_FORCE_REORG" in detail.

If the memory segment of the flash memory which has been used for storage until now is no longer adequate, the flash memory segment which has not been used until now and which is deactivated must be cleared so that the new data can be stored in this block. Both for safety reasons and in order to obtain consistent pointers, it is ensured that all the necessary blocks are contained in a single flash segment (block). For this reason, firstly joined data blocks from the previously used segment must be copied into the currently cleared segment. These data blocks are operational data which are not stored when the control system is operating normally but only at the end of manufacture. These data may be, for example, the current regulator adjustment values and manufacturer's data. The current mode is checked below. If the mode "MODE_FORCE_REORG" triggered by application systems is prescribed, the flash memory is simply reorganized without the current operational data values contained in the RAM memory being taken into account. In this mode, the entire set of the respectively latest operational data blocks is transferred into the flash memory segment to be used now. In contrast, during normal operation "MODE_NORMAL", the current adaptive values contained in the RAM memory, and other operational data, are transferred into the new flash memory segment. The last procedure consists in deactivating the filled block, for which purpose the first data block header is changed from "0'5A5A" to "0'5A00".

If the pointers for the data blocks are not consistent, that is to say more than one data block is contained in that flash memory segment which is cleared at the start of the reorganization function, the data are firstly stored in the RAM memory before the start of the flash memory segment clearing operation. These blocks are then stored again, together with the new data blocks, in the currently cleared flash memory segment.

The correct storage of the data blocks in the flash memory can be checked by making an overall comparison between the data words contained in the RAM memory section and the data words currently copied into the flash memory. When they correspond, the correct storage is confirmed; when they fail to correspond, the memory procedure can be repeated and/or an error message produced.

We claim:

1. A method for storing and retrieving operational data in a control system having a RAM memory and a flash memory, the method comprising.

switching on the control system;

supplying a backup value for only some of the operational data in the control system; and storing each backup value in the RAM memory, without accessing the flash memory; subsequently obtaining most recent operational data of at least one data type from the flash memory; and storing the most recent operational data of the at least one data type in the RAM memory.

2. The method according to claim 1, wherein:

the obtaining step comprises obtaining a plurality of data types from the flash memory; and the step of storing the most recent operational data comprises storing the plurality of data types in the RAM memory.

3. The method according to claim 2, comprising setting at least one pointer to indicate a position and the data type stored in the RAM memory for each respective one of the operational data.

4. The method according to claim 1, comprising:

switching off the control system;

checking if any of the operational data in the RAM memory has been changed subsequent to the step of switching on the control system; and if any of the operational data in the RAM memory has been changed subsequent to the step of switching on the control system; subsequently storing in the flash memory, the operational data in the RAM memory which has been changed subsequent to the step of switching on the control system.

5. The method according to claim 1, comprising:

associating the operational data with a header characterizing the data type; and storing the operational data and the header in the flash memory.

6. The method according to claim 1, comprising using the control system to control a component in an automobile.

7. The method according to claim 1, which comprising using the control system to control an automatic transmission.

8. The method according to claim 1, comprising:

dividing the flash memory into a plurality of segments;

switching off the control system;

storing the operational data in one of the plurality of segments without writing over previously stored operational data; subsequently when the segment becomes full, storing the operational data in a next one of the plurality of segments.

9. The method according to claim 8, comprising associating each one of the plurality of segments with a code indicating whether the respective segment is full, partially full, or empty.

10. The method according to claim 1, comprising:

after at least some of the plurality of segments have been filled;

clearing a segment which has been filled and defining this segment as a cleared segment; and copying operational data from one of the plurality of segments into the cleared segment.

11. The method according to claim 10, wherein the operational data is unchanging data necessary for operating the control system.

12. The method according to claim 8, comprising after the step of storing the operational data in the next one of the plurality of segments:

switching on the control system; and searching for the most recent operational data in a currently activated segment.

13. The method according to claim 12, comprising:

if all types of the most recent operational data are not found in the searching step, searching a deactivated segment for previous values of operational data not found.

14. The method according to claim 1, comprising:

subsequent to the obtaining step, checking an integrity of the operational data; and if an error is found during the integrity check; subsequently searching the flash memory for earlier values of intact operational data of the same data type.

15. The method according to claim 1, comprising:

dividing the flash memory into virtual blocks;

finding an empty one of the virtual blocks by checking the flash memory on a block by block basis; and setting a pointer pointing to the empty one of the virtual blocks.

16. The method according to claim 1, comprising:

switching off the control system;

searching for the most recent operational data contained in the RAM memory;

forming data blocks by combining the most recent operational data;

providing the data blocks with a respective code indicating the data type; and storing the data blocks with the respective code in the flash memory.

17. The method according to claim 16, which comprising before the storing step, determining the total amount of data to be stored in the flash memory.

* * * * *